United States Patent
Kishimoto

(10) Patent No.: US 6,271,119 B1
(45) Date of Patent: Aug. 7, 2001

(54) METHOD FOR MAKING SEMICONDUCTOR DEVICE

(75) Inventor: Koji Kishimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/268,507

(22) Filed: Mar. 11, 1999

(30) Foreign Application Priority Data

Mar. 11, 1998 (JP) .................................................. 10-059690

(51) Int. Cl.⁷ .................................................. H01L 21/4763
(52) U.S. Cl. .......................................... 438/624; 438/622
(58) Field of Search .................................... 438/622, 623, 438/624, 633, 639, 667, 781, 634, 637, 782; 437/52, 60, 195, 231, 238

(56) References Cited

U.S. PATENT DOCUMENTS

| 5,569,618 | * | 10/1996 | Matsubara | 437/52 |
| 5,759,906 | * | 6/1998 | Lou | 438/623 |
| 5,808,363 | * | 9/1998 | Watanabe | 257/758 |
| 6,043,145 | * | 3/2000 | Suzuki et al. | 438/622 |

FOREIGN PATENT DOCUMENTS

| 7-86284 | 3/1995 | (JP) . |
| 7-240460 | 9/1996 | (JP) . |
| 9-246374 | 9/1997 | (JP) . |

* cited by examiner

Primary Examiner—David Nelms
Assistant Examiner—Phuc T. Dang
(74) Attorney, Agent, or Firm—Hutchins, Wheeler & Dittmar

(57) ABSTRACT

A method for making a semiconductor device which has the steps of: (A) forming insulating film on a semiconductor substrate and then a plurality of lower wirings on the insulating film; (B) forming first insulating film with an overhang form to cover the surface of the lower wirings and the insulating film by using a plasma enhanced chemical vapor deposition method; (C) forming organic-included coating insulating film on the first insulating film by using a rotational coating method, (D) baking the organic-included coating insulating film; (E) etching back a part of the organic-included coating insulating film by using a dry-etching method; (F) forming second insulating film on the first insulating film and the organic-included coating insulating film by using the plasma enhanced chemical vapor deposition method; (G) polishing the second insulating film by using a chemical mechanical polishing method to planarize the surface, (H) etching a predetermined part of the first insulating film and the second insulating film to form a hole to reach the lower wirings; and (I) burying a metal material into the hole.

20 Claims, 7 Drawing Sheets

- 107a LOWER WIRING
- 107b
- 107c
- 107d
- 107e
- 106 TITANIUM NITRIDE FILM
- 105 Al-Cu ALLOY FILM
- 104 TITANIUM NITRIDE FILM
- 103 TITANIUM FILM
- 102 INSULATING FILM
- 101 SILICON SUBSTRATE

108 FIRST SILICON DIOXIDE FILM

109 ORGANIC-CONTAINED COATING INSULATING FILM

- 110a ORGANIC-CONTAINED COATING INSULATING FILM
- 110b
- 110c 110d 110e
- 110f

111 SECOND SILICON DIOXIDE FILM

112 SECOND SILICON DIOXIDE FILM
113a VIA HOLE
113b
120 INTERLAYER DIELECTRIC FILM

TUNGSTEN FILM 116a
116b
UPPER WIRING 119
118 TITANIUM NITRIDE FILM
117 Al-Cu ALLOY FILM
115 TITANIUM NITRIDE FILM
114 TITANIUM FILM

301 FIRST ORGANIC-CONTAINED COATING INSULATING FILM

302a VOID  302b  302c

303a FIRST ORGANIC-CONTAINED COATING INSULATING FILM 303b  303c    303d  303e  303f    303g

304 SECOND ORGANIC-CONTAINED COATING INSULATING FILM

METHOD FOR MAKING SEMICONDUCTOR DEVICE

FIELD OF THE INVENTION

This invention relates to a method for a semiconductor device with a multilayer wiring structure and, more particularly, to a method for forming an interlayer dielectric film so as to get a planarization in chip size.

BACKGROUND OF THE INVENTION

The operating speed of semiconductor device decreases as the product RC (time constant) of wiring resistance (R) and parasitic capacitance (c) between wirings increases, and the parasitic capacitance (C) between wirings increases inversely proportional to the interval of wirings. Therefore, in order to enhance the operating speed of semiconductor device, it is important that the parasitic capacitance is reduced.

The parasitic capacitance between different layers can be reduced by increasing the thickness of interlayer dielectric film. On the other hand, in order to reduce the parasitic capacitance between same layers, any one of the ways to increase the wiring interval, to reduce the wiring height and to use a low-specific-permittivity interlayer insulating film is necessary of them, the ways to increase the wiring interval and to reduce the wiring height are not suitable since they go against the recent trends that, with the micro-structuring of semiconductor device, the wiring interval is decreased and the aspect ratio between wirings (wiring thickness(=wiring height)/interval of wirings) is increased. So, for wirings of same layers, it is necessary to reduce the parasitic capacitance by filling the low-specific-permittivity interlayer insulating film. Especially for part with narrow wiring interval and part with high aspect ratio between wirings, since RC (time constant) is essentially high as described earlier, it is highly necessary to fill the low-specific-permittivity interlayer insulating film.

On the other, multilayer wiring has been in wide use with the micro-structuring of semiconductor device. As the interlayer dielectric film for semiconductor device with multilayer wiring, silicon-dioxide-system insulating film is used. However, when metal such as aluminum etc. is used as the wiring material, the temperature in forming the interlayer dielectric film is limited lower than 450° C. So, PE-TEOS film is wide used as the interlayer dielectric film. PE-TEOS film is silicon dioxide film formed by plasma enhanced chemical vapor deposition using TEOS (tetraethylorthosilicate). The specific permittivity of PE-TEOS film is about 4.2 to 4.4. However, when buried insulating film is formed only by PE-TEOS film, there is room for improvement at points below. Namely, a wiring gap with wiring interval of shorter than 0.5 μm and aspect ratio of higher than 1 cannot be completely buried, and therefore a void is likely to occur between the microwirings. Also, the unevenness of surface is likely to increase, which may cause an etch residue of metal in dry-etching the upper metal wiring and a disconnection of upper wiring itself.

Accordingly, the method to bury a low-specific-permittivity insulating film between the micro-wirings and to planarize the surface has been needed. Such a method is known as conventional methods described below.

The first conventional method is reported by Furusawa et al. in Symposium on VLSI Technology, 1995. This method uses an interlayer dielectric film having the sandwich structure that organic SOG (spin on glass) film with a low specific permittivity of 3.0 is sandwiched by upper and lower PE-TEOS films with specific permittivity of 4.5. Here, organic SOG film is left on the entire surface without etching-back (non-etch-back process). Thus, it has the structure that organic SOG film is exposed at the sidewall of via hole.

FIGS. 1A to 1C are cross sectional views showing in sequence the steps of the first conventional method for making a semiconductor device. First, as shown in FIG. 1A, insulating film 602 is formed on the entire surface of a silicon substrate 601, and then lower wirings 603a to 603c of metal film mainly composed of aluminum are formed using photolithography and dry etching method. On these wirings, first silicon dioxide film 604 of FE-TEOS film is thin formed as a contact layer. Further thereon, organic-contained SOG (organicSOG) film 605 with a specific permittivity of 3.0 is formed by coating-baking method. Finally, on the entire surface, second silicon dioxide film 606 of PE-TEOS film is thin formed. Thus, interlayer dielectric film 615 composed of three layers of the first silicon dioxide film 604, organic SOG film 605 and second silicon dioxide film 606 is formed.

Then, as shown in FIG. 1B, by photolithography and dry etching method, via holes 608a, 608b are formed using photoresist 607 as a mask. When photoresist 607 is removed with oxygen plasma, the following method is used. For the first step, at a low pressure of 1.2 mTorr, using oxygen reactive ion etching method, the surface of organic SOG film 605 that is exposed on the sidewall of the via holes 608a, 608b is vitrified. For the second step, at a low pressure of 1 Torr, photoresist 607 is removed ashing with oxygen. Especially this step is shown in FIG. 1B. Finally, in order to completely remove the residue of photoresist, the wet-type photoresist removal is conducted. With the above steps, the desired via holes 608a, 608b are formed in the interlayer dielectric film 615.

Finally, as shown in FIG. 1C, by sputtering method, titanium film 610 and titanium nitride film 611 are formed on the entire surface. Then, by thermal CVD (chemical vapor deposition) method, tungsten film 612 is formed.

The second conventional method is disclosed in Japanese patent application laid-open No.8-107149 (1996). In this publication, the first and third embodiments are applicable to coating-system organic-contained insulating film. FIGS. 2A to 2C are cross sectional views showing in sequence the steps of the second conventional method, which especially corresponds to the third embodiment in the publication. The difference between the first and third embodiments is just about whether first oxide upper layer 704 is formed over a metal conductor 703 or not. Both of the embodiments use interlayer dielectric film 710 having the sandwich structure composed of three layers of oxide liner 706, low-permittivity film 708 and second oxide upper layer 709. The characteristic points are that base-layer insulating film 702 is dug down when forming the metal conductor 703, and that the oxide liner 706 is formed thinner at the side of wiring than on the top of wiring Owing to these points, a sufficient amount of low-permittivity film 708 can be buried between the wirings, thereby reducing the parasitic capacitance between the wirings. This method is explained below, referring to FIGS. 2A to 2C.

First, as shown in FIG. 2A, insulating film 702 is formed on the entire surface of a silicon substrate 701, and then metal film mainly composed of aluminum-copper alloy and its upper oxide layer are formed into the first oxide upper layer 704 and metal conductor 703, using photolithography and dry etching method. In this step, insulating film 702 is dug down about 100 nm. Thereon, the oxide layer 706 of PE-TEOS film is formed. In this step, the oxide liner 706 is formed thinner at the side of wiring than on the top of wiring.

Then, as shown in FIG. 2B, low-permittivity film 707 of organic SOG is formed by coating-baking method.

Then, as shown in FIG. 2C, the low-permittivity film 707 is etched back designating time until it becomes lower than the top of the oxide liner 706, thereby forming the low-permittivity film 708 between the metal conductors. Then, the second oxide upper layer of PE-TEOS film 709 is formed on the entire surface. As a result, the interlayer dielectric film 710 composed of three layers of oxide liner 706, low-permittivity film 708 and second oxide upper layer 709.

However, in the first conventional method, as shown in FIG. 1B, when the photoresist 607 is removed ashing with oxygen plasma 609, the organic SOG film 605 exposed at the sidewall of the via holes 608a, 608b is likely to contract or retreat. When using the organic SOG film, it is necessary to increase the content of organic component so as to reduce the specific permittivity. However, when increasing the content of organic component, the component to be vitrified at the surface of the organic SOG film decreases and therefore the anti-oxygen-plasma-etching characteristic is deteriorated This is why the above phenomenon occurs.

Also, in the first conventional method, as shown in FIG. 1C, when the tungsten film 612 is formed on the entire surface, voids 613a, 613b are likely to occur in the via holes 608a, 608b. It is a defect called poisoned via. The first reason why this phenomenon occurs is that water absorbed is discharged from the organic SOG film 605 when forming the tungsten film 612. Also, the second reason is that due to the contraction or retreating of the organic SOG film 605, the titanium film 610 and titanium nitride film 611 are not formed at the sidewall of the via hole when forming them by sputtering.

The above problems in the first conventional method are further detailed below. In general, organic SOG film has silicon dioxide as a matrix, and includes an organic component such as methyl group ($CH_3$—). Since it includes the organic component and has a density lower than silicon dioxide film, the specific permittivity of organic SOG film is lower than that ($\epsilon$=3.9) of silicon dioxide film. The permittivity of organic SOG film reduces as the content of organic component increases. Also, since the organic SOG film has the organic component, it has a hydrophobic property and it has a hygroscopic property lower than inorganic SOG film whereas it is porous. Therefore, normally, there occurs no increase in specific permittivity caused by the moisture absorption. However, as the organic component is oxidized by oxygen plasma treatment to give inorganic silicon dioxide film, it starts absorbing moisture. Thus, for organic SOG film that has a low permittivity and much organic component, when the via hole is formed in the interlayer dielectric film by photolithography and dry etching method and then the oxygen plasma ashing treatment is conducted for removing the photoresist, the organic component of organic SOG film exposed at the sidewall of the via hole is oxidized and removed. Along with the oxidation, the organic SOG film exposed at the sidewall contracts or retreats. Also, the contracted organic SOG film is inorganized nearby the via hole and starts absorbing moisture. Thereafter, when the upper wiring is formed by sputtering method, water absorbed evaporates from the organic SOG film at the via hole, expanding the volume to cause a poisoned via defect.

In the first conventional method, by vitrifying (inorganizing) the organic SOG-film exposed at the sidewall of the via hole by oxygen reactive ion etching, the occurrence of poisoned via defect is suppressed. However, to increase the content of organic component to reduce the permittivity causes a decrease for the component vitrified, therefore incurring the above problem.

Also, in the first conventional method, when the tungsten film 612 is formed on the entire surface as shown in FIG. 1C, a crack 614 is likely to occur in the interlayer dielectric film 615 since thicker organic SOG film is formed in the large-area part (part with a wide interval of wirings). This is because the organic SOG film 605, which is formed by coating-baking method, contracts every time the thermal treatment at around 400° C. such as blanket tungsten growth or annealing is conducted and thereby the internal stress occurs. The planarization of the entire chip depends on the coating characteristic of the organic SOG film 605, and it is necessary to thicken the organic SOG film 605 to obtain a sufficient planarization. However, as the thickness of the organic SOG film 605 increases, the internal stress (tensile stress) also increases. When the internal stress is greater than a given value, the crack 614 occurs. This problem becomes significant especially in case of a multilayer structure.

In the second conventional method, as shown in FIG. 2C, it is difficult to obtain a sufficient planarization by the etching back method to the organic SOG film 707. This is because the over-etching is required in order to completely remove the organic SOG film 707 from the via-hole-forming region to avoid the poisoned via defect as described earlier. Namely, as the coating characteristic of organic SOG film, organic SOG film having a same thickness as a region where no metal conductor exists must be formed on the large-area metal conductor 703. To completely remove the organic SoG filmon the metal conductor causes a deterioration in planarization since the base-layer oxide liner is difficult to etch. A further reason is that the organic SOG film 707 between micro-wirings must be etched in the etching back when the oxide liner 706 is only formed thinner at the side of wiring than on the top of wiring.

Further, when applying the first and second conventional methods to the multilayer structure, it is difficult to obtain the planarization of the entire chip to form a micro-structured wiring and via hole. This is because as the coating characteristic of organic SOG film, organic SOG film having a same thickness as a region where no metal conductor exists must be formed on the large-area metal conductor. Therefore, the absolute step of the large-area metal conductor remains in situ. When the step is accumulated according as the number of wiring layers is increased two to three or more, the absolute step may exceed the focus margin for photolithography. In this case, it is impossible to form a micro-structured wiring and via hole.

SUMMARY OF THE INVENTION

Accordingly, it is an object of the invention to provide a method for making a semiconductor device whose capacitance between micro-wirings is reduced to enhance the operation speed and whose planarization in chip size is obtained. The method of this invention is characterized in that organic-included coating insulating film a low permittivity is buried into only between the micro-wirings.

According to the invention, a method for making a semiconductor device, comprises:

a step (A) of forming insulating film on a semiconductor substrate and then a plurality of lower wirings on the insulating film;

a step (B) of forming first insulating film with an overhang form to cover the surface of the lower wirings and the insulating film by using a plasma enhanced chemical vapor deposition method;

a step (C) of forming organic-included coating insulating film on the first insulating film by using a rotational coating method, a step (D) of baking the organic-included coating insulating film;

a step (E) of etching back a part of the organic-included coating insulating film by using a dry-etching method;

a step (F) of forming second insulating film on the first insulating film and the organic-included coating insulating film by using the plasma enhanced chemical vapor deposition method; and a step (G) of polishing the second insulating film by using a chemical mechanical polishing method to planarize the surface.

In addition, the method for making a semiconductor device preferably includes, after the step (G), a step (H) of etching a predetermined part of the first insulating film and the second insulating film to form a hole to reach the lower wirings; and a step (I) of burying a metal material into the hole In the step (B) of this invention, the first insulating film is deposited to form an overhang by plasma enhanced chemical vapor deposition method. "to form an overhang" means to allow the sidewall to form an overhang. The overhang form is, for example, shown by the first insulating film (first silicon dioxide film) in FIG. 3B. Namely, it is a form that the interval between adjacent lower wirings 107 is narrower at the top than at the bottom, so that the opening is narrowed. With such a form, the structure in FIG. 3D is obtained when etching back the organic-included coating insulating film 109 in the step (E). Thus, the following effects are obtained.

With the narrowed opening, due to the micro-loading effect, the organic-included coating insulating film 109 with a low permittivity formed between the narrow micro-wirings is left without being etched and removed (FIG. 3D). Especially for part with narrow wiring interval and part with high aspect ratio between wirings, since RC (time constant) is essentially high as described earlier, it is highly necessary to fill the low-specific-permittivity interlayer insulating film. This invention satisfies such a requirement. Meanwhile, also at part with wide wiring interval, the organic-included coating insulating film 109 with some thickness is left (FIG. 3D).

The organic-included coating insulating film 109 formed on the first insulating film 108 is removed by etching (FIG. 2D). Therefore, the second insulating film (second silicon dioxide film 111) is deposited directly on the first insulating film 108 (FIG. 3E). Thus, when etching the first and second insulating films to make a hole in the step (H), the second silicon dioxide film 111 is exposed at the sidewall of the hole and the organic SOG film is not exposed (FIG. 3F). In the conventional method, the organic SOG film 605 is exposed as shown in FIG. 1B and therefore the exposed surface must be over-etched, which causes a reduction in the burying characteristic of metal material into the hole. The present invention gives a solution to this problem, therefore the burying characteristic can be improved.

At part with a wide wiring interval, the organic SOG film is formed only at the sidewall as shown in FIG. 3D (110a, 110b and 110c). In the conventional method, such part is buried completely with the organic SOG film and the organic SOG film is formed thick, which causes a crack (FIG. 1C). The present invention also gives a solution to this problem.

In this invention, in order to get the above effects, it is preferable that the etching-back in the step (E) is conducted such that the organic-included coating insulating film formed on the first insulating film is substantially completely removed.

According to another aspect of the invention, a method for making a semiconductor device, comprises;

a step (A) of forming insulating film on a semiconductor substrate and then a plurality of lower wirings on the insulating film;

a step (B) of forming first insulating film with an overhang form to cover the surface of the lower wirings and the insulating film by using a plasma enhanced chemical vapor deposition method;

a step (C) of forming first organic-included coating insulating film on the first insulating film by using a rotational coating method, a step (D) of removing a part of the first organic-included coating insulating film by a rotational removing method;

a step (E) of baking the first organic-included coating insulating film;

a step (F) of forming second organic-included coating insulating film on the first insulating film and the first organic-included coating insulating film using a rotational coating method;

a step (G) of baking the second organic-included coating insulating film;

a step (H) of etching back a part of the first organic-included coating insulating film and the second organic-included coating insulating film by using a dry-etching method;

a step (I) of forming second insulating film on the first insulating film, the organic-included coating insulating film and the second organic-included coating insulating film by using the plasma enhanced chemical vapor deposition method; and a step (J) of polishing the second insulating film by using a chemical mechanical polishing method to planarize the surface.

In addition, the method for making a semiconductor device preferably includes, after the step (J), a step (K) of etching a predetermined part of the first insulating film and the second insulating film to form a hole to reach the lower wirings; and a step (L) of burying a metal material into the hole.

The above aspect of the invention is characterized in that the rotational coating and removing are repeated when coating with the organic-included coating insulating film. It is an effective way especially for the case that a void between micro-wirings is likely to be left for one try of rotational coating. The case that a void between micro-wirings is likely to be left is, for example, when the opening between the micro-wirings is very small, or when the organic-included coating insulating film with a poor burying characteristic is used. In this invention, between the first-time rotational coating of organic-included coating insulating film and the second-time or later rotational coating, the concentration of a solution for the organic-included coating insulating film may be changed. When the solid content lowers, though the film thickness capable of being coated at one try decreases, the burying characteristic can be enhanced. Thus, when the solution concentration is reduced at the first-time coating, the burying characteristic can be enhanced.

In this invention, in order to get the above effects, it is preferable that the etching-back in the step (H) is conducted such that the organic-included coating insulating film formed on the first insulating film is substantially completely removed.

In this invention, the organic-included coating insulating film is formed by rotational coating method. The rotational coating method is conducted by setting a silicon substrate horizontally, adsorbing the silicon substrate by a vacuum chuck, dropping a solution, in which the organic-included coating insulating film material is solved in alcohol or ketone, on the surface, then rotating the substrate. Thus, the organic-included coating insulating film is formed uniformly on the surface of the substrate. The film thickness is controlled by setting a rotation number and time. For organic SOG film, the material contained is silicon dioxide as a matrix, which includes in-molecule organic-system branched chain, e.g., methyl group, ethyl group and phenol group. As the content of silicon dioxide decreases, the permittivity reduces. The rotational removing method is conducted by removing the organic-included coating insulating film by a solvent while rotating the substrate, before applying the heat treatment to the organic-included coating insulating film formed by the rotational coating.

The baking of organic-included coating insulating film is, in general, conducted by evaporating the solvent by a heat treatment at 200° C. or lower on a hot plate oven, then condensing and hardening the organic-included coating insulating film by a heat treatment at 350° C. or higher in a heat treatment furnace. The heat treatment on the hot plate oven may be divided into several steps, where the temperature is raised step by step.

In this invention, between the step (B) of forming first insulating film with an overhang form to cover the surface of the lower wirings and the insulating film by using a plasma enhanced chemical vapor deposition method and the step (c) of forming first organic-included coating insulating film on the first insulating film by using a rotational coating method, the step of etching the first insulating film by sputtering may be inserted.

With the etching step inserted, the base-layer insulating film 102 is dug down as shown in FIG. 3E, so that a sufficient amount of low-permittivity material (organic SOG film) can be buried into between wirings. Thus, the parasitic capacitance can be reduced.

Also, in this invention, it is preferable that the plasma enhanced chemical vapor deposition method to form the first insulating film in the step (B) uses monosilane ($SiH_4$) and oxygen or oxygen-included compound as raw materials. For example, the silicon dioxide film is deposited by plasma CVD method using $SiH_4$ and $O_2$ as row materials. Thereby, the first silicon dioxide film can easily form an overhang. Further, by using high-density plasma CVD method that RF power is applied to the silicon substrate, a desired form of overhang can be made even between finer micro-wirings.

In this invention, the first silicon dioxide film may be silicon dioxide film, silicon dioxide with its surface nitrified, silicon oxide-nitride film or the like. For the silicon dioxide with its surface nitrified orsilicon oxide-nitride film, theetch selectivity between the first silicon dioxide film as a base layer and the organic-included coating insulating film in the step of etching back the organic-included coating insulating film can be enhanced. Thus, a multilayer wiring structure with a finer wiring interval can be obtained.

The method for making a semiconductor device in the invention is especially effective for the case that the interval of lower wirings is narrow. Namely, it is effective for an interval of lower wirings of 0.5 µm or shorter, and is further effective for an interval of lower wirings of 0.35 µm or shorter.

BRIEF DESCRIPTION OF THE DRAWINGS

The invention will be explained in more detail in conjunction with the appended drawings, wherein.

DESCRIPTION OF THE PREFERRED EMBODIMENTS

Figure 1A:
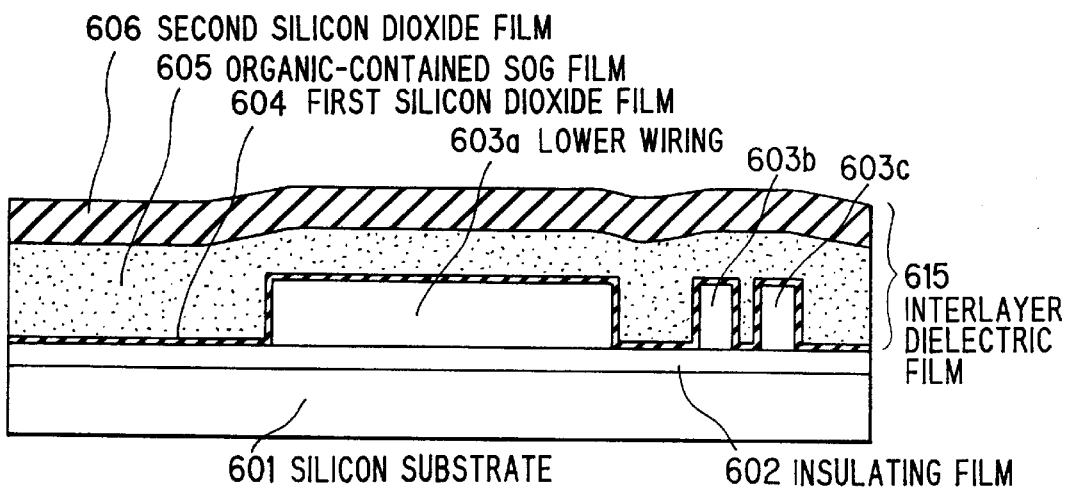
FIGS. 1A to 1C are cross sectional views showing in sequence the steps of the first conventional method.
Figure 1B:
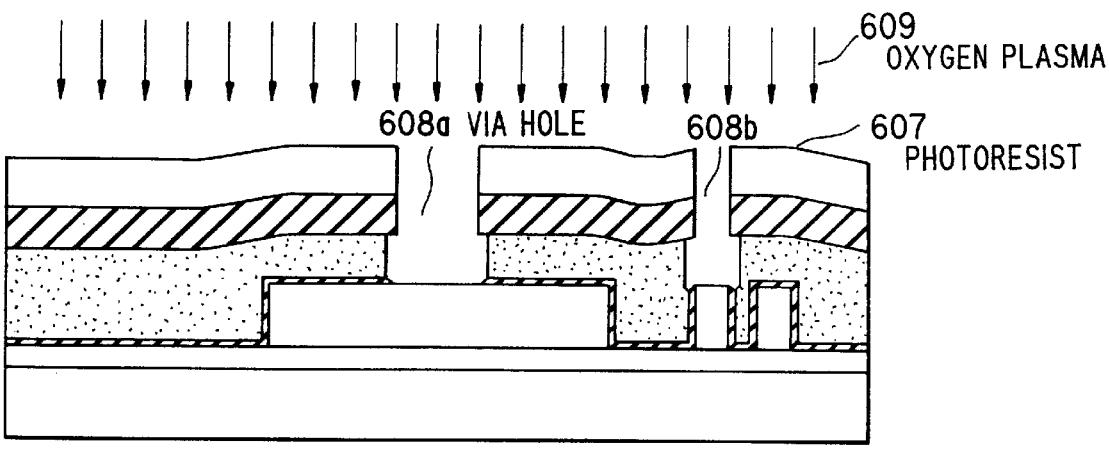
Figure 1C:
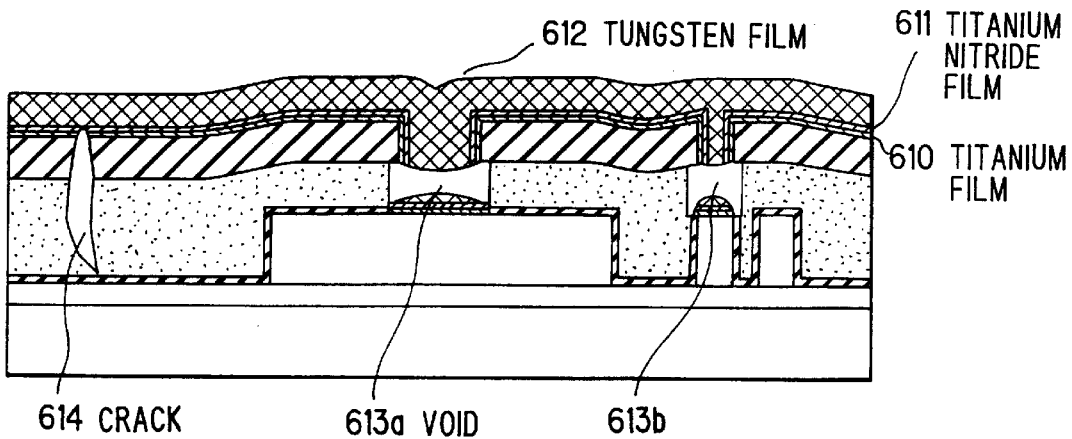
Figure 2A:
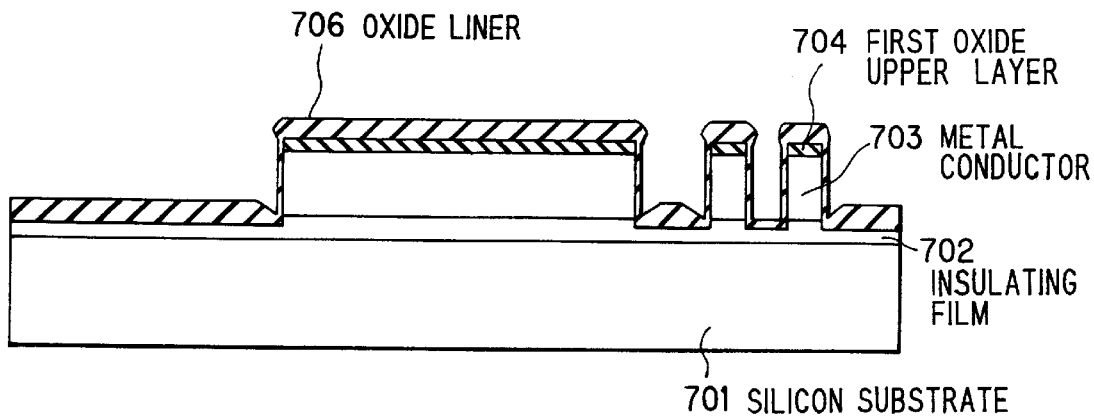
FIGS. 2A to 2C are cross sectional views showing in sequence the steps of the second conventional method.
Figure 2B:
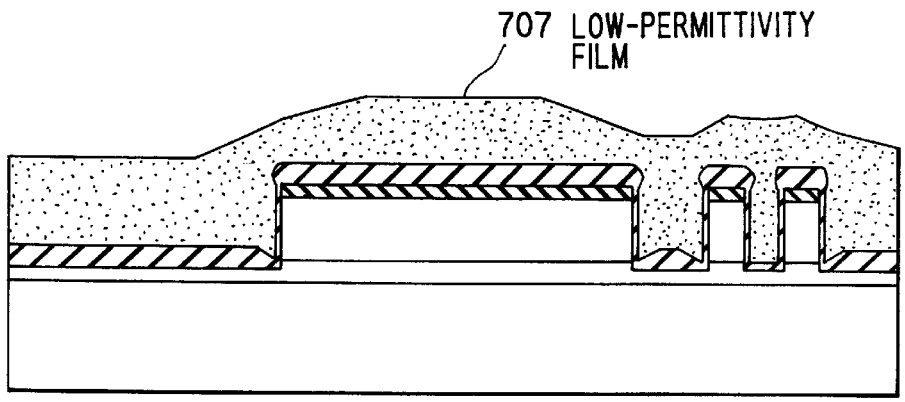
Figure 2C:
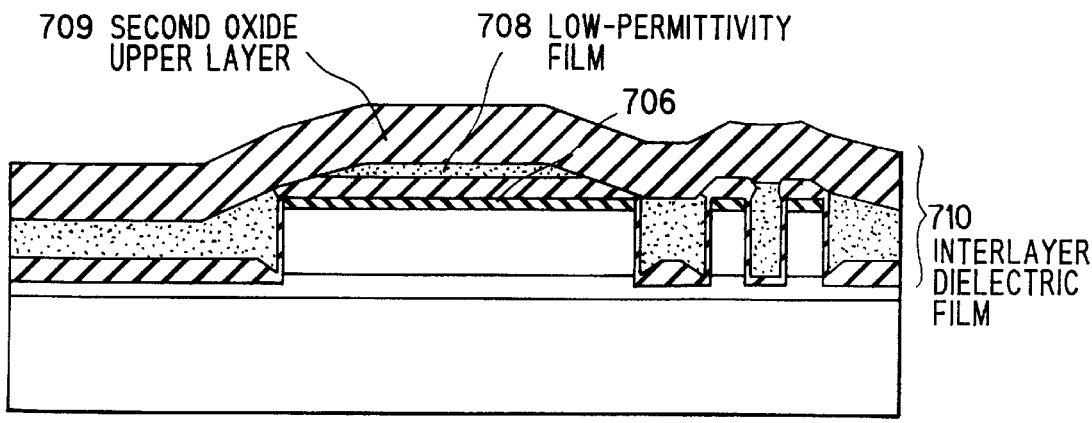

The preferred embodiments of the invention will be explained below, referring to the drawings.

FIGS. 3A to 3G are cross sectional views showing in sequence the steps of a method for making a semiconductor device in the first preferred embodiment according to the invention.

Figure 3A:
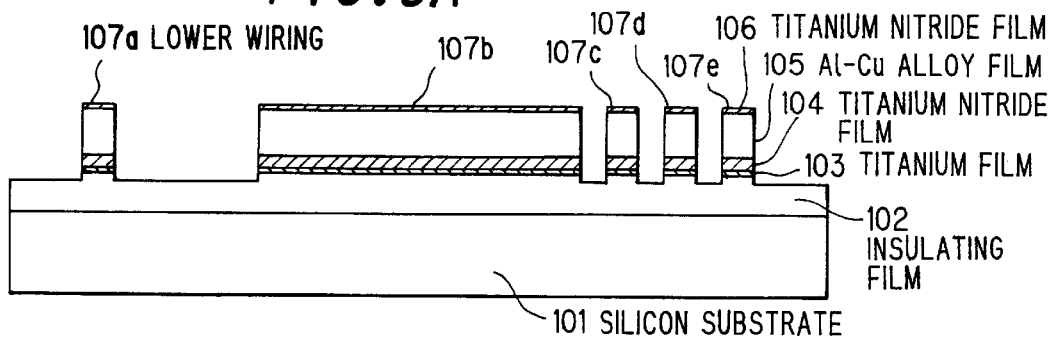
FIGS. 3A to 3G are cross sectional views showing in sequence the steps of a method for making a semiconductor device in a first preferred embodiment according to the invention.

First, as shown in FIG. 3A, after forming a given semiconductor element (not shown) on a silicon substrate 101, BPSG (borophosphosilicate glass) film, for example, is formed as the base-layer insulating film on the entire surface. Then, insulating film 102 annealed by RTA (rapid thermal annealing) is formed, and then required contact holes (not shown) are formed. Then, forming sequentially titanium film 103 of about 30 nm thick, titanium nitride film 104 of about 100 nm thick, aluminum-copper alloy film 105 of 450 nm thick, and titanium nitride film 106 of about 50 nm thick by sputtering method, the multilayer metal film of about 630 nm thick is obtained. Then, patterning this by a known method, lower wirings 107a to 107e are formed. After etching the lower wirings 107a to 107e, the base-layer insulating film 102 is dug down about 0.2 µm (FIG. 3A). The minimum space interval among the lower wirings 107a to 107e is made about 0.3 µm. For such part, the aspect ratio of space between two lower wirings is about 2.8 at the maximum.

Figure 3B:
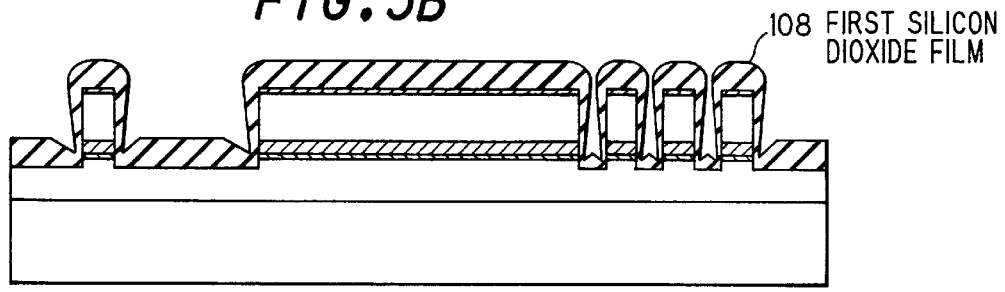

Then, as shown in FIG. 3B, on the insulating film 102 and lower wirings 107a to 107e, first silicon dioxide film (first insulating film) 108 is deposited about 300 nm by a parallel plate plasma CVD system. In this step, the deposition conditions of the first silicon dioxide film 108 are to use $SiH_4$ and $N_2O$ as raw materials and to apply about 0.8 W/cm$^2$ with a RF voltage of 13.56 MHz to the opposed electrode. Also, the film-forming pressure is made about 2.2 Torr and the flow ratio of $N_2O$ to $SiH_4$ is made about 20. Further, the substrate temperature in growing the film is kept about 400° C. At this stage, between micro-wirings of the lower wirings 107a to 107e, there occur overhangs since the first silicon dioxide film 108 gives projecting parts at the shoulders of the lower wirings. Plasma CVD method using $SiH_4$ as a raw material, where the vapor-phase reaction occurs mainly, gives a more extreme overhang form than that by plasma CVD method using TEOS (tetraethylorthosilicate) as a raw material. Here, the grooves are intentionally formed between the micro-wirings such that the overhangs do not contact each other. In general, insulating film is formed on an actual wiring pattern and the conditions such as film thickness etc. are determined by confirming it by cross-sectional SEM (secondary-electronimage) observation. Also, theminimumwiring interval is predetermined at the circuit-mask design stage, and the conditions are altered for each generation. In this case, the opening of the groove may be opened such that organic-included coating insulating film 109 can be buried into at the later stage. The interval is set properly according to the burying characteristic of the organic-included coating insulating film 109.

Figure 3C:
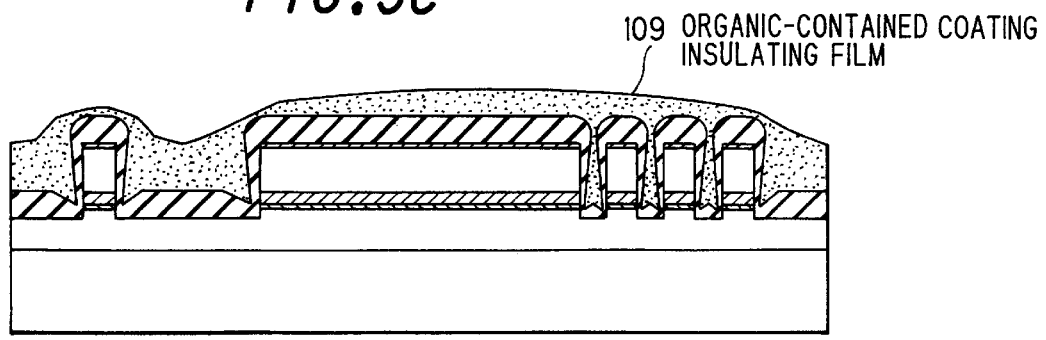

Then, as shown in FIG. 3C, the organic-included coating insulating film 109 is coated and baked on the entire surface. As the organic-included coating insulating film 109, organic SOG film, HSG-2209S-R7 commercially available from Hitachi Chemical Co., Ltd., is used. After coating, heat treatments of about 140° C. for 3 min. and about 275° C. for 3 min. are conducted on a hot plate oven. Then, using a heat treatment furnace, heat treatment is conducted at 450° C. for one hour in a nitrogen atmosphere. The organic-included coating insulating film 109 has an excellent burying characteristic onto the first silicon dioxide film 108, so that it can be buried into even between the micro-wirings. In this embodiment, the width is made about 500 nm. Meanwhile, in the organic-included coating insulating film, the higher the content of organic component is, the more the burying characteristic into between the micro-wirings is enhanced. The reason is that in the organic-included coating insulating film including organic component such as —CH$_3$ etc., the burying characteristic is enhanced all the more since the organic component is repelled by the base-layer silicon dioxide film, whereas in typical inorganic-system SOG film, the burying characteristic deteriorates all the more since the hydrogen bonding with the base-layer silicon dioxide film can be formed because the end of molecule is terminated with silanol bonding (Si—OH). When the content of organic component is very large, there occurs a mottling in SOG film depending on the uneven form of base layer. Even in this case, the organic-included coating insulating film can be left between the micro-wirings, thereby buried thereinto completely. As described earlier, since especially for part with narrow wiring interval, it is highly necessary to fill the low-permittivity SOG film, it is preferable that the organic component such as —CH$_3$ etc. is included more. Meanwhile, the burying characteristic and wettability also depend on the solid content. When the solid content lowers, though the film thickness capable of being coated at one try decreases, the burying characteristic can be enhanced.

In this embodiment, since the insulating film 102 is dug down at the step in FIG. 3A and the first silicon dioxide film 108 forms the overhang as shown in FIG. 3B, a sufficient amount of the organic-included coating insulating film 109 can be buried into between the micro-wirings. Thus, the permittivity between the micro-wirings can be reduced.

Figure 3D:
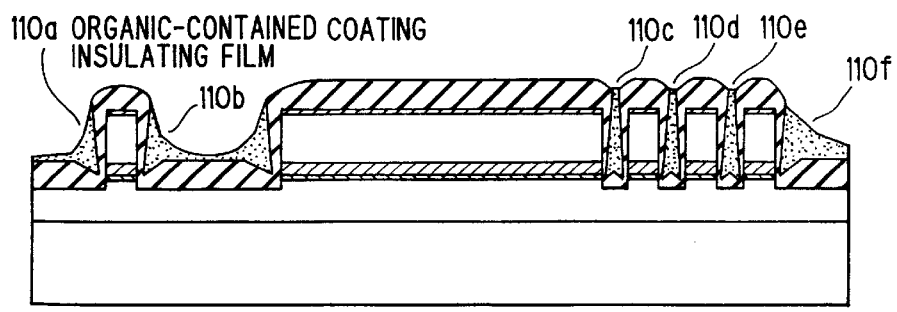

Then, as shown in FIG. 3D, the entire surface of the organic-included coating insulating film 109 is etched back. In this step, the organic-included coating insulating film 109 including the organic component may be etched selectively by introducing oxygen into fluorocarbon-system gas, e.g., $CF_4$. In detail, using a parallel plate etching system, mixture gas of $C_2F_6$, $O_2$ and He is introduced at a ratio approximately of 5:1:15. With pressure of about 240 Pa and power of about 2 W/cm, the entire-surface etching back is conducted. The higher the ratio of $O_2$ flow rate to the gas flow rate of fluorocarbon system is made, the easier the organic-included coating insulating film 109 is etched. Therefore, a high etch selectivity can be obtained between the film 109 and the first silicon dioxide film 108 that is not etched. The etch selectivity increases according as the content of organic component in the organic-included coating insulating film 109 increases.

Also, organic-included coating insulating films 110c, 110d and 110e between the micro-wirings are not etched back due to the micro-loading effect of the overhangs formed with the base-layer first silicon dioxide film 108. On the contrary, the large-area organic-included coating insulating film (part with the wide wiring interval) is almost etched back. As a result, for the large-are apart, organic-included coating insulating films 110a, 110b and 110f are left only on the sidewall of wiring. In this case, the etching-back may be conducted such that the organic-included coating insulating film on the lower wiring where a via hole is formed can be etched back completely and there occurs no crack at large-area part where no lower wiring exists when forming a multilayer wiring structure.

Figure 3E:
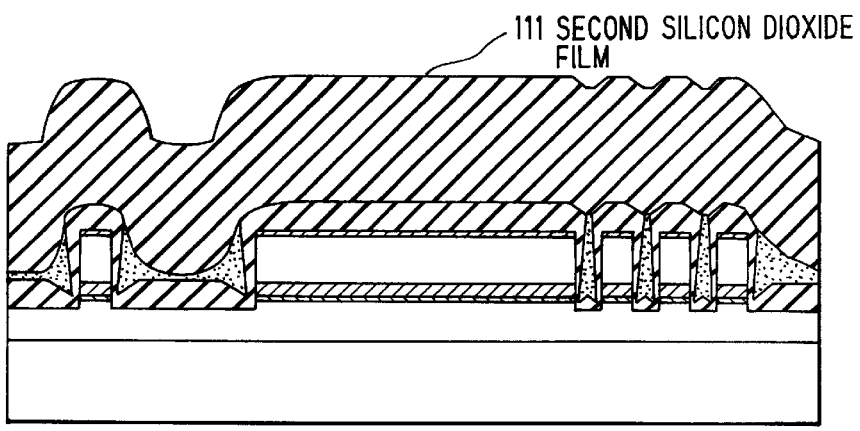

Then, as shown in FIG. 3E, using a parallel plate plasma CVD system and TEOS and $O_2$ as raw materials, second silicon dioxide film 111 of about 1.6 $\mu$m thick is deposited on the first silicon dioxide film 108 and organic-included coating insulating films 110a to 110f. Here, the second silicon dioxide film 111 is deposited higher than the top surface of the lower wirings 107a to 107e so as not to leave any 'hole'.

Figure 3F:
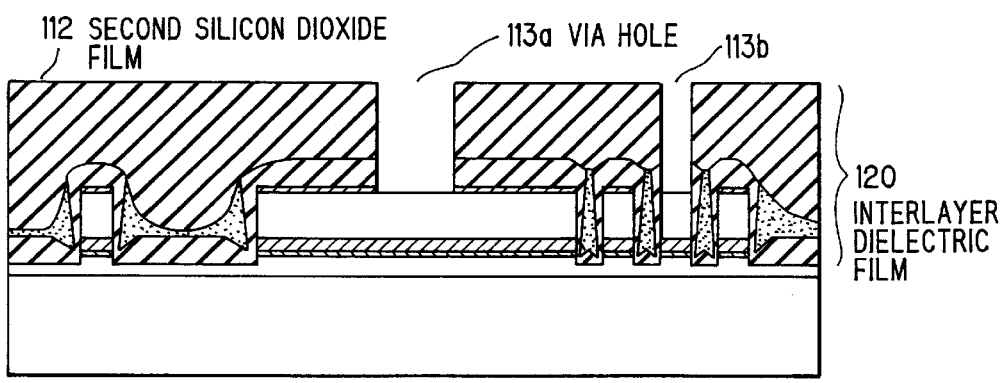

Then, as shown in FIG. 3F, using CMP (chemical mechanical polishing) method, the second silicon dioxide film 111 is polished for planarizing its surface. In this step, the polishing for planarization is conducted such that the total thickness of the first silicon dioxide film 108 and second silicon dioxide film 111 on the lower wirings 107a to 107e is left about 800 nm. Then, conducting heat treatment of about 400° C. for about 10 min. in a nitrogen atmosphere, the planarized interlayer dielectric film 120 composed of the first silicon dioxide film 108, organic-included coating insulating films 110a to 110f and second silicon dioxide film 111 is formed. Then, using photolithography and dry-etching method, via holes 113a, 113b are formed on the lower wirings 107a and 107d. In this step, the titanium nitride film 106 at the bottom of the via holes is removed completely to expose the surface of the aluminum-copper alloy film 105.

Figure 3G:
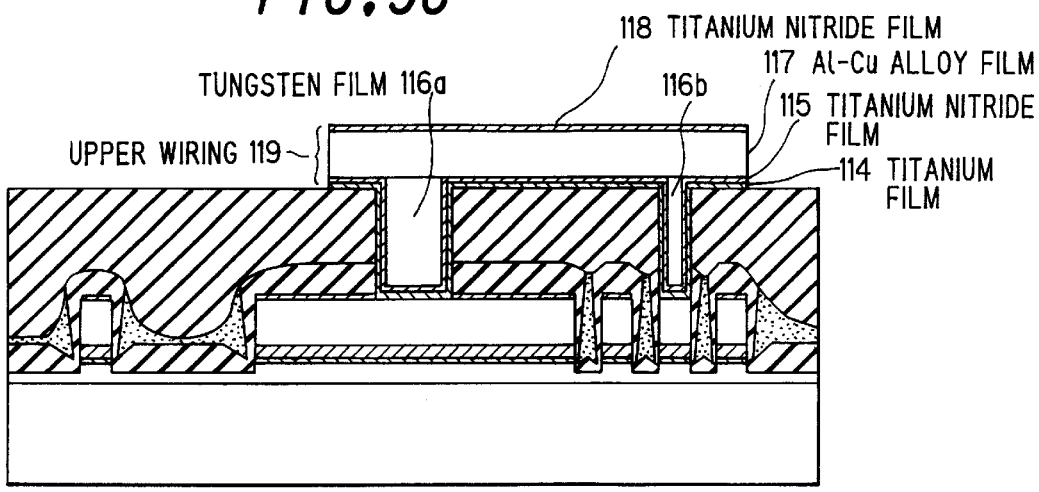

Finally, as shown in FIG. 3G, after forming titanium film 114 and titanium nitride film 115 by sputtering method on the entire surface, tungsten film is deposited on the entire surface by CVD method and then the entire-surface etching-back is conducted, thereby obtaining the state that tungsten films 116a and 116b are buried into only the via holes 113a and 113b. Then, after forming aluminum-copper alloy film 117 and titanium nitride film 118 by sputtering method, upper wiring 119 is formed by using photolithography and dry-etching method. Thereby, a semiconductor device with the two-layer wiring structure is obtained. In the semiconductor device obtained, neither of via defect and crack was founded.

Although in this embodiment, as shown in FIG. 3B, the first silicon dioxide film 108 is deposited using $SiH_4$ and $N_2O$ as raw materials and the parallel plate plasma CVD system, another method to form silicon dioxide film with the overhang can be used. For example, the silicon dioxide film may be deposited using $SiH_4$ and $O_2$ as raw materials and a high-density plasma CVD system. In this case, the deposition condition is to apply about 1.0 W/cm$^2$ with a RF voltage of 13.56 MHz to the silicon substrate 101. Also, the RF source power is about 3000 W, the pressure is about 6 mTorr and the flow rate ratio of $O_2$ to $SiH_4$ are about 2.0. Also in this case, the silicon dioxide film with the overhang can be formed between the micro-wirings.

Although in this embodiment, as shown in FIG. 3B, the tops do not contact between the micro-wirings, there is no problem even when the tops contact each other thereby causing a void between the wirings, If the tops are contacting each other, then Ar-sputtering etching is conducted to open the groove between the micro-wirings. The Ar-sputtering etching is, for example, conducted as below. Introducing Ar by a parallel plate plasma treatment system, at in-chamber pressure of about 20 mTorr, a RF voltage of 13.56 MHz is applied about 1.0 W/cm$^2$ to the substrate electrode side. Further, the reactive ion etching-back may be conducted introducing fluorocarbon-system gas, e.g., $CF_4$. In this case, the etching-back occurs on the entire surface, which causes a film loss on the entire surface.

Although in this embodiment, as shown in FIG. 3E, the second silicon dioxide film is deposited using TEOS and $O_2$ as raw materials and the parallel plate plasma CVD system, another method without leaving any 'hole' can be used. For example, the second silicon dioxide film 111 may be deposited $SiH_4$, $O_2$ and Ar as raw materials and a high-density plasma CVD system to apply a RF voltage to the substrate. An example of the deposition condition is explained below. A RF voltage of 13.56 MHz is applied to the silicon substrate 101. Also, the RF source power is about 3000 W, the RF power to be applied to the substrate is about 7.5 W/cm$_2$, the pressure is about 6 mTorr and the flow rate ratio of $O_2$ to $SiH_4$ are about 1.4.

Figure 4A:
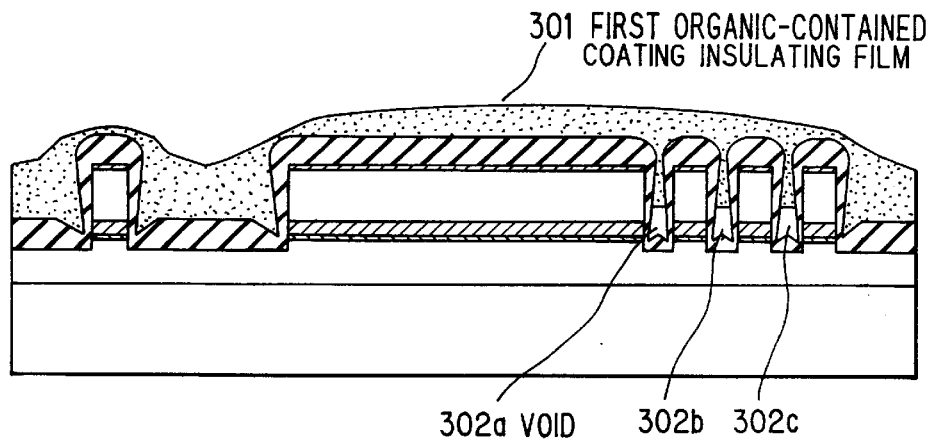
FIGS. 4A to 4C are cross sectional views showing in sequence the steps of a method for making a semiconductor device in a second preferred embodiment according to the invention.
Figure 4B:
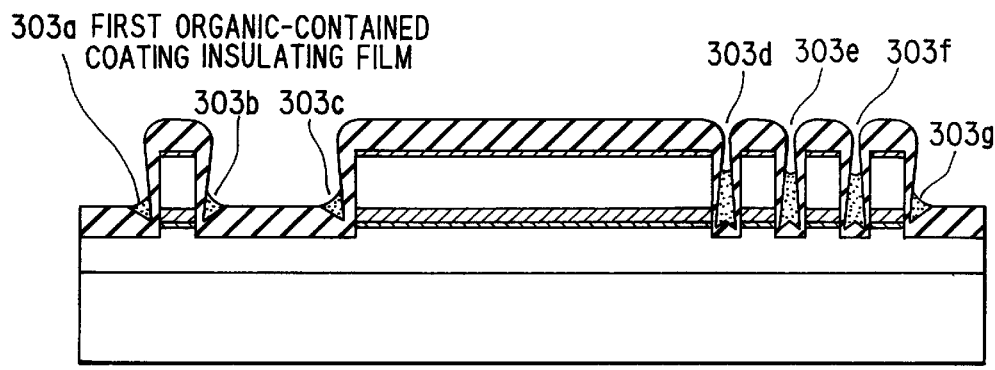
Figure 4C:
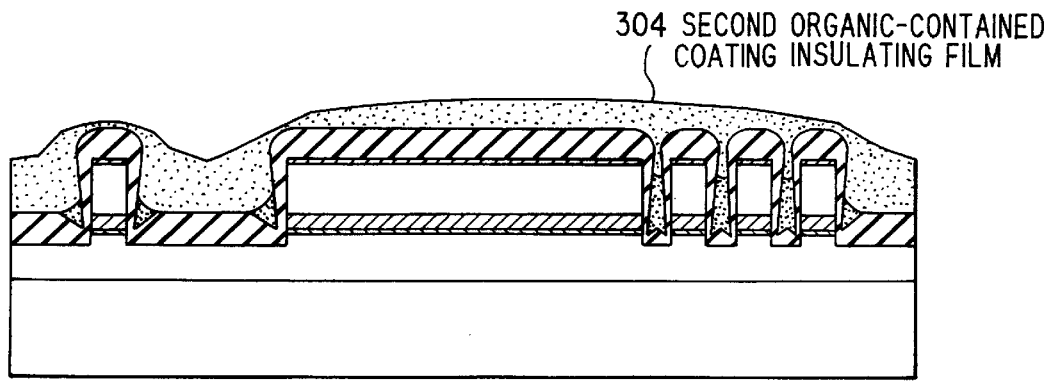

FIGS. 4A to 4C are cross sectional views showing in sequence the steps of a method for making a semiconductor device in the second preferred embodiment according to the invention.

This embodiment is characterized in that the rotational coating and removing are repeated when coating with the organic-included coating insulating film. The method of this embodiment is an effective way for the case that a void between micro-wirings must be left for one try of rotational coating, for example, when the opening between the micro-wirings in the base-layer first silicon dioxide film 108 is very small, or when the burying characteristic of organic-included coating insulating film 301 is bad. In detail, it is effective for the case that the opening between the micro-wirings in the base-layer first silicon dioxide film 108 is as small as 500 nm or less, or that the viscosity of the organic-included coating insulating film 301 is high.

In this embodiment, at first, the same processes as shown in FIGS. 3A and 3B are conducted. Namely, by the same process as shown in FIG. 3A, the base-layer micro-wirings and the first silicon dioxide film are formed.

Then, as shown in FIG. 4A, the organic-included coating insulating film 301 is formed on the entire surface by rotational coating. As the organic-included coating insulating film 301, organic insulating film FLARE 1.0 (fluirinated poly arylether) commercially available from Allied Signal Co. Ltd. is used. At the coating stage, voids 302a, 302b and 302c generate. If baking it by using a hot plate oven and a furnace, they will be left in situ. So, as shown in FIG. 4B, just after the coating with the organic-included coating insulating film 301, the rotational removing by a solvent is conducted. Although as the characteristic of rotational removing, the organic-included coating insulating film between the micro-wirings cannot be removed, the organic-included coating insulating film on a wide pattern or part having no pattern can he all removed. Therefore, first organic-included coating insulating films 303d, 303e and 303f each are left between the micro-wirings. On the other hand, at wide and flat part having no lower wiring, first organic-included coating insulating films 303a, 303b, 303c and 303g are left at the sidewall corners of the lower wirings 107a, 107b and 107e. If a void is left between the micro-wirings even when conducting one try of rotational coating and rotational removing, then the rotational coating and rotational removing are repeated several times, thereby the void can be removed completely.

After conducting the rotational coating as described above, the heat treatments are conducted at about 80° C. for one min., at about 110° C. for one min. and at about 150° C. for one min. Then, using a heat treatment furnace, where leading into and out of the furnace at the room temperature, the heat treatment is conducted at 400° C. for one hour in a nitrogen atmosphere.

Then, as shown in FIG. 4C, second organic-included coating insulating film 304 is formed coating and baking on the entire surface. As the second organic-included coating insulating film 304, organic insulating film PAE2 (poly arylether) commercially available from Schumacker co. Ltd. is used. After the coating, the heat treatments are conducted at about 80° C. for 2 min. and at about 280° C. for 2 min. on the hot plate oven. Then, using the heat treatment furnace, the heat treatment is conducted at 425° ° C. for 20 min. in a 20%-oxygen-included nitrogen atmosphere. At this stage, the organic-included coating insulating film 109 in the first embodiment shown in FIG. 3C corresponds to two layers of the first organic-included coating insulating films 303a to 303g and the second organic-included-coating insulating film 304 in FIG. 4C.

Even when the solid content of organic-included coating solution in FIG. 4B is made considerably small, the same effect as described earlier can be obtained. In this case, though as the property of coating solution, non-uniformity in coating occurs due to the base pattern, the first organic-included coating insulating films 303d, 303e and 303f are left securely between the micro-wirings. Further, in this case, it is preferable that the second organic-included coating insulating film 304 has a normal level of solid content of organic-included coating solution. Namely, it is preferable that the solid content of the first organic-included coating insulating films 303a to 303g is different from that the second organic-included coating insulating film 304.

Then, through processes similar to those shown in FIGS. 3D to 3G in the first embodiment, a semiconductor device with the two-layer wiring structure is obtained.

The third preferred embodiment of the invention is intended to enhance the etch selectivity between the base-layer first insulating film and the organic-included coating insulating film, in the process of etching back the organic-included coating insulating film. In this embodiment, the enhancement in etch selectivity is attained by nitrifying the surface of the base-layer first silicon dioxide film.

Figure 5:
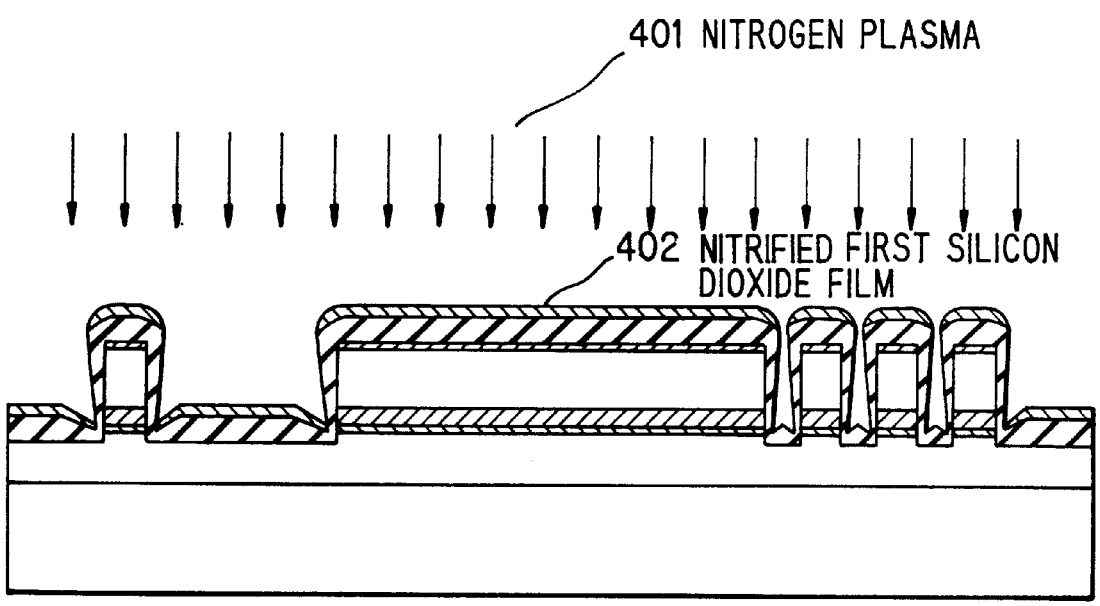
FIG. 5 is a cross sectional view showing the step of a method for making a semiconductor device in a third preferred embodiment according to the invention.

FIG. 5 is a cross sectional view showing a process after conducting the same processes as those in FIGS. 3A and 3B. Namely, the base layer micro-wirings are formed using the same process as shown in FIG. 3A, and the first silicon dioxide film is formed using the same process as shown in FIG. 3B. This embodiment is characterized in that the process in FIG. 5 is inserted between the processes in FIGS. 3B and 3C.

In this embodiment, after the processes in FIGS. 3A and 3B, as shown in FIG. 5, the entire surface of the first silicon dioxide film is nitrified by nitrogen plasma 401 to give the nitrified first silicon dioxide film 402. The nitrogen-plasma generating conditions are using an inductively coupled plasma generating system, pressure of about 10 mTorr, nitrogen ($N_2$) flow rate of about 200 sccm, and source power of 3000 W. A RF power of about 0.3 W/cm$^2$ with a RF frequency of 2 MHz is applied to the substrate, the processing time is about 300 sec. Under these conditions, the silicon substrate is nitrified by about 5 nm. For the silicon dioxide film by plasma CVD growth method, the nitrogen concentration is high at uppermost-surface part, and decreases according as going in the depth direction. As a result, part of about 10 nm from the surface is nitrified.

Then, like the process in FIG. 3C, the organic-included coating insulating film is formed on the entire surface, then etching back the entire surface of the organic-included coating insulating film. In this case, since the surface of the base-layer silicon dioxide film is nitrified, there is a merit that the dry-etching rate is lower than that in the non-nitrified silicon dioxide film. Due to this merit, a film loss in the base-layer silicon dioxide film when etching back is reduced, and therefore the first silicon dioxide film is allowed to form thinner. Thus, the method in this embodiment is especially effective for very narrow micro-wirings. Although an increase in permittivity caused by the nitrification may be worried about, the sidewall between the micro-wirings is not nitrified since only the surface of the base-layer silicon dioxide film is nitrified. Therefore, there occurs no increase in permittivity between the micro-wirings.

Then, through processes similar to those shown in FIGS. 3D to 3G in the first embodiment, a semiconductor device with the two-layer wiring structure is obtained. In the semiconductor device obtained, neither of via defect and crack was founded.

The fourth preferred embodiment of the invention is intended to enhance the etch selectivity between the base-layer first insulating film and the organic-included coating insulating film, in the process of etching back the organic-included coating insulating film. In this embodiment, the enhancement in etch selectivity is attained by using silicon oxide-nitride film as the base-layer first insulating film, instead of the first silicon dioxide film.

Figure 6:
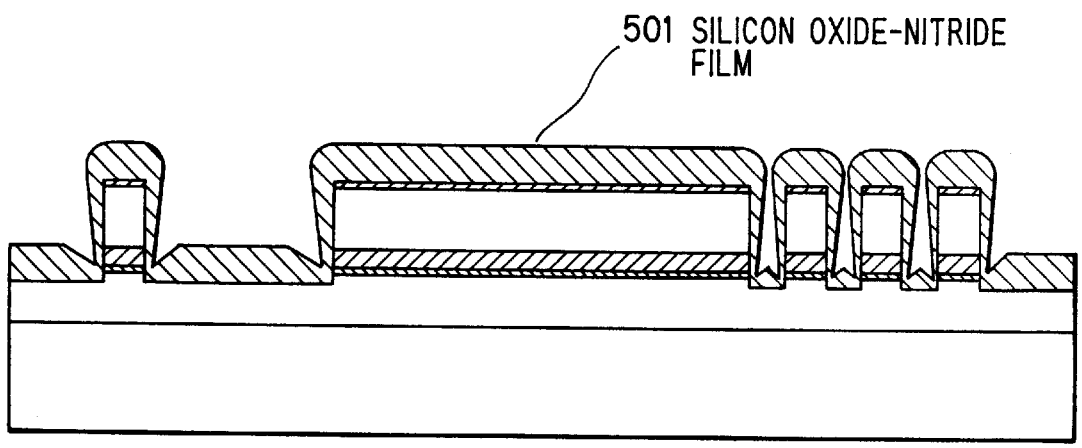
FIG. 6 is a cross sectional view showing the step of a method for making a semiconductor device in a fourth preferred embodiment according to the invention.

FIG. 6 is a cross sectional view showing a process after conducting the same processes as those in FIG. 3A. Namely, the base layer micro-wirings are formed using the same process as shown in FIG. 3A. Then, the process shown in FIG. 6 is conducted as below. Namely, using a parallel plate plasma CVD system, silicon oxide-nitride film 501 of about 300 nm is deposited on the insulating film 102 and lower wirings 107a to 107e. Here, the deposition conditions of the silicon oxide-nitride film 501 are to use $SiH_4$, $NH_3$, $N_2O$ and $N_2$ as raw materials, to apply about 0.2 W/cm$^2$ a RF voltage of 250 kHz to the substrate-side electrode, and to apply about 0.4 W/cm$^2$ a RF voltage of 13.56 MHz to the opposed electrode. Also, the film-forming pressure is about 2 Torr, and the flow rate ratio of $NH_3$, $N_2O$ and $N_2$ to $SiH_4$ is approximately 1:6:1.5:4. Further, the substrate temperature in the process of growing the film is kept about 400° C. Under these conditions, the silicon oxide-nitride film 501 with a refractive index of about 1.84, a film stress of about $1.0 \times 10^9$ dyne/cm$^2$ on the compression side and a good uniformity is obtained. At this stage, between micro-wirings of the lower wirings 107a to 107e, there occur overhangs since the silicon oxide-nitride film 501 gives protecting parts at the shoulders of the lower wirings. To include nitrogen in the silicon dioxide film gives a merit that the dry-etching rate in the later process of etching back the organic-included coating insulating film is lower than that in the non-nitrified silicon dioxide film. Due to this merit, a film loss in the base-layer silicon dioxide film when etching back is reduced, and therefore the first silicon dioxide film is allowed to form thinner. Also, since the film itself is made uniform in the depth direction, this method can be applied to even micro-wirings with a further narrower interval than that in the third embodiment. However, since the sidewall between micro-wirings is made of silicon oxide-nitride film as well, the permittivity between micro-wirings increases slightly, comparing with that in the third embodiment In forming the silicon oxide-nitride film by CVD plasma method using $SiH_4$ as a raw material, to reduce the flow rate ratio of $N_2O$ causes an increase in the nitrogen content of the silicon oxide-nitride film, thereby giving a more extreme overhang form that that in the silicon dioxide film by plasma CVD using $SiH_4$ as a raw material. Therefore, a merit that the silicon oxide-nitride film is difficult to deposit on the sidewall between the micro-wirings can be obtained.

Then, like the process in FIG. 3C, the organic-included coating insulating film is formed on the entire surface, then etching back the entire surface of the organic-included coating insulating film. Then, through processes similar to those shown in FIGS. 3D to 3G in the first embodiment, a semiconductor device with the two-layer wiring structure is obtained. In the semiconductor device obtained, neither of via defect and crack was founded.

Although in the above embodiments only the two-layer structures are described, it can be, of course, applied to a multilayer structure of three or more layers.

Advantages of the Invention

As explained above, in the method for making a semiconductor device according to the invention, since the first silicon dioxide film is made forming an overhang by plasma CVD method, the organic-included coating insulating film with a low permittivity can be buried into only between the micro-wirings. Therefore, the organic insulating film is not exposed at the sidewall of via hole, so that the poisoned via can be effectively prevented from occurring. Also, since the organic SOG film is formed only at the sidewall in a region with a wide wiring interval, a good anti-crack characteristic can be obtained.

Also, since a sufficient planarization in chip size is obtained by CMP method, it is not necessary to provide a focus margin. Therefore, comparing the conventional method, finer wiring and via hole can be formed.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for making a semiconductor device, comprising:

a step (A) of forming insulating film on a semiconductor substrate and then a plurality of lower wirings on said insulating film;

a step (B) of forming first insulating film with an overhang form to cover the surface of said lower wirings and said insulating film by using a plasma enhanced chemical vapor deposition method;

a step (C) of forming organic-included coating insulating film on said first insulating film by using a rotational coating method, a step (D) of baking said organic-included coating insulating film;

a step (E) of etching back a part of said organic-included coating insulating film by using a dry-etching method;

a step (F) of forming second insulating film on said first insulating film and said organic-included coating insulating film by using the plasma enhanced chemical vapor deposition method; and a step (G) of polishing said second insulating film by using a chemical mechanical polishing method to planarize the surface.

2. A method for making a semiconductor device, according to claim 1, further comprising:

after said step (G);

a step (H) of etching a predetermined part of said first insulating film and said second insulating film to form a via hole to reach said lower wiring; and a step (I) of providing a metal material into said hole.

3. A method for making a semiconductor device, according to claim 1, wherein:

said etching-back in said step (E) is conducted such that said organic-included coating insulating film formed on said lower wiring is substantially completely removed to form a via hole.

4. A method for making a semiconductor device, according to claim 2, wherein:

said etching-back in said step (E) is conducted such that said organic-included coating insulating film formed on said lower winlng where a via hole is formed is substantially completely removed to form a via hole.

5. A method for making a semiconductor device, comprising:

a step (A) of forming insulating film on a semiconductor substrate and then a plurality of lower wirings on said insulating film;

a step (B) of forming first insulating film with an overhang form to cover the surface of said lower wirings and said insulating film by using a plasma enhanced chemical vapor deposition method;

a step (C) of forming first organic-included coating insulating film on said first insulating film by using a rotational coating method, a step (D) of removing a part of said first organic-included coating insulating film by a rotational removing method;

a step (E) of baking said first organic-included coating insulating film;

a step (F) of forming second organic-included coating insulating film on said first insulating film and said first organic-included coating insulating film using a rotational coating method;

a step (G) of baking said second organic-included coating insulating film;

a step (H) of etching back a part of said first organic-included coating insulating film and said second organic-included coating insulating film by using a dry-etching method;

a step (I) of forming second insulating film on said first insulating film, said organic-included coating insulating film and said second organic-included coating insulating film by using the plasma enhanced chemical vapor deposition method; and a step (J) of polishing said second insulating film by using a chemical mechanical polishing method to planarize the surface.

6. A method for making a semiconductor device, according to claim 5, further comprising:

after said step (J);

a step (K) of etching a predetermined part of said first insulating film and said second insulating film to form a via hole to reach said lower wirings; and a step (L) of providing a metal material into said hole.

7. A method for making a semiconductor device, according to claim 5, wherein:

said catching-back in said step (H) is conducted such that said organic-included coating insulating films formed on said lower wiring are substantially completely removed to form a via hole.

8. A method for making a semiconductor device, according to claim 6, wherein:

said etching-back in said step (H) is conducted such that said organic-included coating insulating films formed on said lower wiring are substantially completely removed to form a via hole.

9. A method for making a semiconductor device, according to claim 1, further comprising:

between said step (B) and said step (C);

a step of etching a portion of said first insulating film by sputtering.

10. A method for making a semiconductor device, according to claim 2, further comprising:

between said step (B) and said step (C);

a step of etching a portion of said first insulating film by sputtering.

11. A method for making a semiconductor device, according to claim 5, further comprising:

between said step (B) and said step (C);

a step of etching a portion of said first insulating film by sputtering.

12. A method for making a semiconductor device, according to claim 6, further comprising:

between said step (B) and said step (C);

a step of etching a portion of said first insulating film by sputtering.

13. A method for making a semiconductor device, comprising:

a step (A) of forming insulating film on a semiconductor substrate and then a plurality of lower wirings on said insulating film;

a step (B) of forming first insulating film with an overhang form to cover the surface of said lower wirings and said insulating film by using a plasma enhanced chemical vapor deposition method;

a step (C) of forming organic-included coating insulating film on said first insulating film by using a rotational coating method;

a step (D) of baking said organic-included coating insulating film;

a step (E) of etching back a part of said organic-included coating insulating film by using a dry-etching method;

a step (F) of forming second insulating film on said first insulating film and said organic-included coating insulating film by using the plasma enhanced chemical vapor deposition method; and a step (G) of polishing said second insulating film by using a chemical mechanical polishing method to planarize the surface, wherein:

said plasma enhanced chemical vapor deposition method to form said first insulating film in said step (B) uses monosilane (SiH$_4$) and oxygen or oxygen-included compound as raw materials.

14. A method for making a semiconductor device, comprising:
   a step (A) of forming insulating film on a semiconductor substrate and then a plurality of lower wirings on said insulating film;
   a step (B) of forming first insulating film with an overhang form to cover the surface of said lower wirings and said insulating film by using a plasma enhanced chemical vapor deposition method;
   a step (C) of forming first orsanic-included coating insulating film on said first insulating film by using a rotational coating method;
   a step (D) of removing a part of said first organic-included coating insulating film by a rotational removing method;
   a step (E) of baking said first organic-included coating insulating film;
   a step (F) of forming second organic-included coating insulating film on said first insulating film and said first organic-included coating insulating film using a rotational coating method;
   a step (G) of baking said second organic-included coating insulating film;
   a step (H) of etching back a part of said first organic-included coating insulating film and said second organic-included coating insulating film by using a dry-etching method;
   a step (I) of forming second insulating film on said first insulating film said organic-included coating insulating film and said second organic-included coating insulating film by using the plasma enhanced chemical vapor deposition method; and
   a step (J) of polishing said second insulating film by using a chemical mechanical polishing method to planarize the surface, wherein:
      said plasma enhanced chemical vapor deposition method to form said first insulating film in said step (B) uses monosilane (SiH$_4$) and oxygen or oxygen-included compound as raw materials.

15. A method for making a semiconductor device, comprising:
   a step (A) of forming insulating film on a semiconductor substrate and then a plurality of lower wirings on said insulating film;
   a step (B) of forming first insulating film with an overhang form to cover the surface of said lower wirings and said insulating film by using a plasma enhanced chemical vapor deposition method;
   a step (C) of forming organic-included coating insulating film on said first insulating film by using a rotational coating method;
   a step (D) of baking said organic-included coating insulating film;
   a step (E) of etching back a part of said organic-included coating insulating film by using a dry-etching method;
   a step (F) of forming second insulating film on said first insulating film and said organic-included coating insulating film by using the plasma enhanced chemical vapor deposition method; and
   a step (G) of polishing said second insulating film by using a chemical mechanical polishing method to planarize the surface, wherein:
      said first insulating film is silicon dioxide film whose surface is nitrified.

16. A method for making a semiconductor device, comprising:
   a step (A) of forming insulating film on a semiconductor substrate and then a plurality of lower wirings on said insulating film;
   a step (B) of forming first insulating film with an overhang form to cover the surface of said lower wirings and said insulating film by using a plasma enhanced chemical vapor deposition method;
   a step (C) of forming first organic-included coating insulating film on said first insulating film by using a rotational coating method;
   a step (D) of removing a part of said first organic-included coating insulating film by a rotational removing method;
   a step (E) of baking said first organic-included coating insulating film;
   a step (F) of forming second organic-included coating insulating film on said first insulating film and said first organic-included coating insulating film using a rotational coating method;
   a step (G) of baking said second organic-included coating insulating film;
   a step (H) of etching back a part of said first organic-included coating insulating film and said second organic-included coating insulating film by using a dry-etching method;
   a step (I) of forming second insulating film on said first insulating film, said organic-included coating insulating film and said second organic-included coating insulating film by using the plasma enhanced chemical vapor deposition method; and
   a step (J) of polishing said second insulating film by using a chemical mechanical polishing method to planarize the surface, wherein:
      said first insulating film is silicon dioxide film whose surface is nitrified.

17. A method for making a semiconductor device, comprising:
   a step (A) of forming insulating film on a semiconductor substrate and then a plurality of lower wirings on said insulating film;
   a step (B) of forming first insulating film with an overhang form to cover the surface of said lower wirings and said insulating film by using a plasma enhanced chemical vapor deposition method;
   a step (C) of forming organic-included coating insulating film on said first insulating film by using a rotational coating method;
   a step (D) of baking said organic-included insulating film; a step (E) of etching back a part of said organic-included coating insulating film by using a dry-etching method;
   a step (F) of forming second insulations film on said first insulating film and said organic-included coating insulating film by using the plasma enhanced chemical vapor deposition method; and
   a step (G) of polishing said second insulating film by using a chemical mechanical polishing method to planarize the surface, wherein:
      said first insulating film is silicon oxide-nitride film.

18. A method for making a semiconductor device, comprising:

a step (A) of forming insulating film on a semiconductor substrate and then a plurality of lower wirings on said insulating film;

a step (B) of forming first insulating film with an overhang form to cover the surface of said lower wirings and said insulating film by using a plasma enhanced chemical vapor deposition method;

a step (C) of forming first organic-included coating insulating film on said first insulating film by using, a rotational coating method;

a step (D) of removing a part of said first organic-included coating insulating film by a rotational removing method;

a step (E) of baking said first organic-included coating insulating film;

a step (F) of forming second organic-included coating insulating film on said first insulating, film and said first organic-included coating insulating film using a rotational coating method;

a step (G) of baking said second organic-included coating insulating film;

a step (H) of etching back a part of said first organic-included coating insulating film and said second organic-included coating insulating film by using a dry-etching method;

a step (I) of forming second insulating film on said first insulating film, said organic-included coating insulating film and said second organic-included coating insulating film by using the plasma enhanced chemical vapor deposition method; and a step (J) of polishing said second insulating film by using a chemical mechanical polishing method to planarize the surface, wherein:

said first insulating film is silicon oxide-nitride film.

19. A method for making a semiconductor device, according to claim 1, wherein:

a minimum spacing between individual ones of said plurality of lower wirings is 0.5 um or shorter.

20. A method for making a semiconductor device, according to claim 5, wherein:

a minimum spacing between individual ones of said plurality of lower wirings is 0.5 um or shorter.

* * * * *